July 7, 1959 C. C. BOPP 2,894,150

TRANSISTOR SIGNAL TRANSLATING CIRCUIT

Filed Oct. 7, 1953

INVENTOR.
CALVIN C. BOPP
BY Alden D. Redfield
Atty.

United States Patent Office 2,894,150

Patented July 7, 1959

2,894,150

TRANSISTOR SIGNAL TRANSLATING CIRCUIT

Calvin C. Bopp, Cincinnati, Ohio, assignor to Avco Manufacturing Corporation, Cincinnati, Ohio, a corporation of Delaware Application October 7, 1953, Serial No. 384,745

1 Claim. (Cl. 307—88.5)

Figure 1:
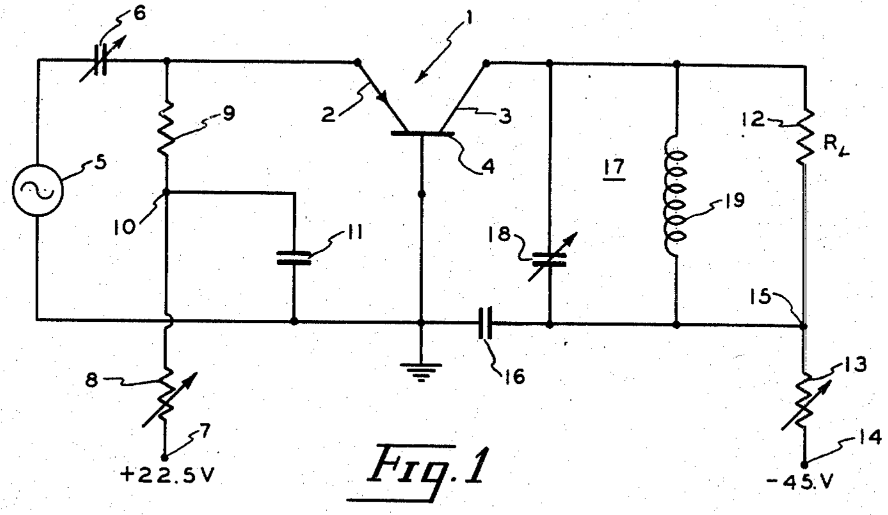

The present invention relates generally to electrical translation circuits including transistors, and more particularly to signal amplitude limiters employing transistor circuits as signal amplitude limiting elements.

It is well known that conventional receivers for detecting frequency modulated signals include as a circuit element a signal amplitude limiting device, incorporated in the receiver antecedent to a frequency discriminator. The function of such a limiter in a frequency modulation receiver is to supply to the frequency discriminator a signal of constant amplitude, so that the output of the frequency discriminator will be representative of signal frequency alone. The limiter is required to remove amplitude modulation of the signal due to noise, or arising in other ways. It is a further requirement of limiters to reduce distortion in frequency modulation receivers by flattening the apparent intermediate frequency selectivity curve of the receiver, and to prevent input circuit detuning at high signal levels. Where the receiver is to be mounted in a mobile unit, immunity to strong impulse type noise is a factor of prime importance, and the function of providing such immunity is accomplished normally by the limiter.

Limiter circuits may or may not have inherent gain, and circuits of both types are known. In frequency modulation receivers which are to be produced in extremely miniaturized versions, the inclusion of gain in the limiter circuit is advantageous, as increasing the overall gain of the receiver at no cost in tube complement. The transistor limiter of the present invention may be arranged to provide amplification, in performance of its primary function, and is suitable for inclusion as the amplitude limiter of a conventional frequency modulation receiver, as well as for other uses.

It is a primary object of the present invention to provide a signal amplitude limiter circuit employing a transistor as an amplitude limiting element.

It is a further object of the invention to provide a novel signal amplitude limiter circuit employing emitter bias variation in response to changes in signal amplitude level as a mechanism for limiting the response of a transistor.

It is another object of the invention to provide a novel signal amplitude limiter employing collector voltage saturation as a mechanism for limiting response of a transistor.

It is still another object of the invention to provide a novel signal amplitude limiter employing emitter bias variation in response to changes in signal amplitude levels and collector voltage saturation, jointly, as a mechanism for limiting response of a transistor.

A further object of the invention resides in the provision of a novel signal amplitude limiter employing emitter bias variation which occurs by rectification in the emitter circuit of a transistor to limit the conduction angle of the transistor.

It is still another object of the invention to provide effective limiting of pulse type signals in an emitter leak type transistor limiter, by shunting the input circuit of the transistor with a varistor.

Briefly describing the invention, and the background of the art pertaining thereto, it has long been known that electric signals may be amplified in circuits including as an active element a treated block of suitable semi-conductive material, together with suitable electrodes. Devices of this character are described in detail in U.S. Patent No. 2,524,035, issued to J. Bardeen and W. H. Brattain, and are commonly denominated transistors. In general, the body of a transistor may comprise a block of germanium, the crystalline structure of which has been altered by introducing slight quantities of impurities. The character of the impurities introduced determines the character of the transistor, and two alternate types exist, known generally as "N-type" and "P-type."

It is known that if N-type germanium is used for the base material small P-type areas exist beneath the point contacts which result in rectifying barriers, the interaction between which permits amplification. Formed point contacts, respectively denominated "emitter" and "collector," are located in spaced proximity to one another and in contact with the block of transistor material. In the junction type transistor the emitter and collector are grown to or alloyed to the base electrode. A third electrode, denoted the "base," is provided, which makes contact with a considerable surface of the block to provide a low resistance terminal.

For the purposes of the following discussion it is assumed that an N-type block having P-type barrier layers is employed, and that the transistor is provided with positive bias at the emitter or input electrode, and negative bias at the collector or output electrode, and operated with grounded base. In the event an alternative type of transistor material is employed, or an alternative ground point, suitable modification of circuit arrangement and/or bias polarity may be required, in the practice of the present invention.

The emitter circuit of a transistor is in some respects analogous to the grid circuit of a vacuum tube. It is capable of rectifying, if operated at a suitable bias point. However, an emitter circuit differs from a vacuum tube grid circuit in that the emitter circuit possesses a relatively low impedance, and secondly, in that its rectifying properties are affected by feed-back from the collector electrode, due to base to ground resistance common to both emitter and collector circuits. The emitter bias circuit, moreover, is operated as a constant current device, the bias voltage being in series with a high impedance.

For small signals the emitter is slightly positive, due to the applied bias. If the amplitude of the signal is increased sufficiently, rectification takes place. If a relatively long time constant emitter circuit is employed, the rectified current drives the emitter bias more negative in almost linear proportion to the increase in signal level, but without substantially changing bias current. At the same time the effective input impedance to alternating current of the emitter circuit increases, but non-linearly and with constantly decreasing slope. Under these conditions, peak currents to the emitter remain constant over a wide range of input levels.

It is desirable, in limiters, that the limiting action be sharp, or that the limiter characteristic curve have a sharp knee. I have found that lower collector currents lead to sharper knees. I therefore operate my novel limiter at the lowest collector current consistent with gain and stability considerations. I have found, in particular, that operation of a WE 1768 transistor with an emitter current of about 0.1 milliampere represents a satisfactory value of bias to secure optimum limiting operation. I realize, however, that other transistor types may require different bias values, in order to attain optimum operating conditions in accordance with the principles of the present invention.

With the emitter type limiter, limiting takes place as the signal biases the D.C. emitter voltage in a negative direction, making the conduction angle of the transistor smaller. To provide effective limiting of pulse-type signal, the build-up of bias variation must take place in a period of time equivalent to the rise time of the pulse. The coupling capacitor normally connected between the emitter of the limiter and a previous stage of a translating system must be as small as possible. As this capacitor is made smaller, however, the advantage gained in improving pulse limiting is offset by a decrease in static signal limiting. After the pulse has passed, the charge on the coupling capacitor will hold the emitter at a reduced voltage, tending to block the signal for a period of time determined by the resistance and capacity of the coupling and bias circuits of the transistor input. Included in the discharge path is the emitter resistance, which is quite high at the end of the pulse, the emitter bias resistor, and the collector bias resistor. While the latter may be neglected, the emitter bias resistance should be low for best results. It is therefore necessary in the design of a transistor limiter of the emitter leak type, to compromise as between values of emitter bias resistance which are optimum for static limiting and for pulse limiting.

I have found that both the static and the dynamic limiting characteristics of an emitter leak type transistor limiter may be enhanced by connecting a varistor diode in the input circuit of the limiter to clip the positive half of the signal wave at some predetermined value. In particularly I have employed the type WE 1764 welded point varistor for this purpose and I have found that conventional point contact diodes do not offer substantial improvement when substituted for the varistor, because of their lower forward conductance.

I have devised an additional mode of effective limiting in transistor circuits, which involves voltage saturation in the collector circuit. I have demonstrated, if a suitable value of collector bias be selected in relation to collector load, that voltage limiting takes place in the collector circuit, even under such conditions that no rectification or limiting by virtue of rectification can occur in the emitter circuit. To this end I have operated a WE 1768 transistor at 0.5 milliampere emitter bias, which is beyond the range at which emitter limiting is substantially present, and utilized a collector load of 5000 ohms, collector current being set at 2.0 milliamperes in one test, and 1.0 milliampere in another. For both cases relatively sharp voltage limiting occurred at the collector. For the lower value of collector current the circuit became unstable at relatively low values of input signal, about 1.0 volt peak-to-peak, but for the higher value of collector bias stability was excellent over a wide range of value of input signal magnitude.

As still a further mode of operation the two devices for obtaining limiting action in transistor circuits may be combined, so that limiting occurs by virtue of both collector voltage and collector current saturation. To this end a satisfactory emitter bias was found to be 0.1 ma. and a satisfactory collector current 2.0 ma. for the WE 1768 transistor. The values stated are not critical, however, but represent a compromise, and a considerable range of values adjacent those states may be employed.

Figure 2:
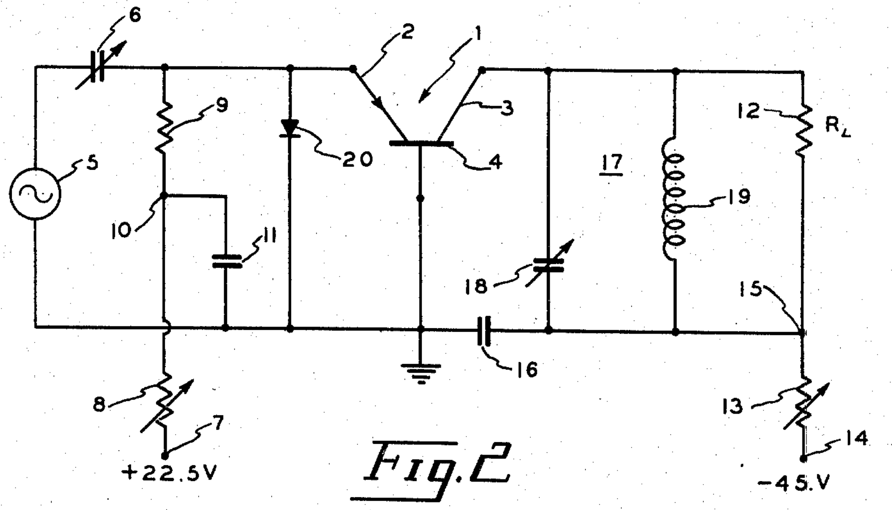

The invention will be fully apprehended from the following detailed description of certain preferred embodiments thereof, especially when taken in conjunction with the accompanying drawings, wherein:

Figure 1 is a schematic circuit diagram of a basic transistor limiter in accordance with the invention; and Figure 2 is a schematic circuit diagram of a modification of the system of Figure 1, employing a varistor to enhance pulse limiting.

Referring now more specifically to Figure 1 of the accompanying drawings, the reference numeral 1 denotes a transistor, which may be of the WE 1768 type, having an emitter electrode 2, a collector electrode 3 and a base 4. The base 4 is connected directly to ground. The emitter electrode 2 is connected to a source of frequency modulated carrier signal 5, via a coupling capacitor 6, and is biased from a positive voltage terminal 7, in series with two relatively high resistors, 8 and 9, connected in series with each other, and coupled to ground at their junction point 10, by means of a by-pass capacitor 11.

The collector electrode 3 is connected with a load resistance 12, a variable resistance 13, and a suitable negative voltage terminal 14, all in series. The junction 15, between the resistances 12 and 13, is connected to ground via an isolating and by-pass condenser 16, and a parallel tuned tank circuit 17, composed of capacitor 18 and inductance 19, is connected in shunt to the load resistance 12, and tuned to the frequency of the input signal provided by source 5.

The resistances 8 and 13 are made variable, so that operating conditions of the circuit may be readily modified, and are so constructed that each of them may be reduced to zero.

Among circuit values which have been tested, and found to operate in a satisfactory manner, are the following:

| | |
|---|---|
| Transistor type | WE 1768. |
| Resistance **8** | 250,000 ohms. |
| Resistance **9** | 2,300 ohms. |
| Capacitor **11** | .10 mfd. |
| Resistance **12** | Range of values in ohms, 5,000 to 20,000. |
| Resistance **13** | 25,000 ohms. |
| Capacitor **16** | .10 mfd. |
| Operating frequency of source **5** | 455 kilocycles. |

Reviewing now briefly the operation of the system of Figure 1 of the accompanying drawings, a frequency modulated carrier is supplied from source 5 to the input of the amplitude limiter circuit forming the subject-matter of my invention. The source 5 is coupled to the emitter electrode 2 of transistor 1 via a coupling capacitor 6. The emitter electrode 2 is biased to conduct in a forward direction from positive voltage applied to terminal 7, in series with resistance 8, 9, and the time constant of the input circuit is arranged to be long compared with one cycle of the input frequency supplied from source 5. The base electrode 4 is grounded, and the collector electrode 3 is connected to drive a parallel resonant tank circuit 17, and is biased to conduct in reverse direction from a negative voltage source (not illustrated) connected to terminal 14. The circuit described is capable of employing, or of supplying an amplified signal to load $R_L$.

In accordance with one mode of operation, the emitter electrode 2 is biased at a relatively low value of current, say about 0.1 ma. Small signals, deriving from source 5, capable of producing A.C. emitter currents in excess of this value, then cause the emitter to rectify. By virtue of the relatively long time constant in the emitter circuit the emitter electrode 2 then assumes a D.C. voltage bias which is proportional in magnitude to the applied signal level. Under these conditions peak collector current will remain essentially constant over a wide range of input levels, which causes the output voltage to remain essentially constant.

In accordance with a further preferred mode of operation, the emitter electrode may be biased positively at a relatively heavy value of bias current (about 0.5 ma.), so that rectification cannot occur in the input circuit. In such case, however, the collector current bias is relatively low, say about 2.0 ma., and with a load (about 5000 ohms) such that the load line would terminate at or near cut-off. In such case driving the emitter with a signal of greater than a given magnitude does not appreciably increase collector voltage, despite the fact that emitter current is linear, and despite the fact that no rectification takes place in the emitter circuit.

As still a further mode of operation, a compromise may be effected, as between the two recited modes of operation, involving both emitter circuit rectification and collector electrode saturation.

Referring now more particularly to Figure 2 of the accompanying drawings, the arrangement is generally identical with that of Figure 1 of the accompanying drawings, operating as an "emitter leak" type limiter, i.e., with emitter D.C. bias variation due to emitter circuit rectification, and accordingly the same numerals of reference have been employed to describe identical circuit components in both figures of the drawings. In the embodiment of my invention illustrated in Figure 2 of the accompanying drawings, in distinction to Figure 1, a varistor 20 is connected directly between emitter electrode 2 and ground. The varistor 20 is the type WE 1764 welded point varistor and possesses an A.C. impedance somewhat lower than that of the emitter of transistor 1. Varistor 20 thereby is effective in maintaining signal constant at the higher signal levels, and in reducing response to short high amplitude pulses, while enabling design of the limiter circuit, and particularly of the time constants of the input circuit of the transistor, for more effective static operation. In general, a design suitable for most effective static limiting, in the absence of varistor 20, is found to be non-optimum for short pulse limiting, and vice versa. By inclusion of varistor 20, so connected as to clip the positive half of the signal wave at a predetermined level, the limiter circuits may be designed for optimum static limiting action, and highly effective pulse limiting simultaneously attained.

While I have described and illustrated a specific embodiment of my invention, it will be clear that use of equivalent elements and variations of circuit values, and of details of circuit arrangement, may be resorted to without departing from the true spirit and scope of the invention as defined in the appended claim.

What I claim is:

In a signal translating circuit, the combination of a transistor having an emitter electrode, a base electrode and a collector electrode, means connected between collector and base electrodes for applying reverse-direction bias currents to form a high-impedance collector-to-base circuit, said means comprising an inductance, capacity and load impedance in parallel, a resistance in series with said load impedance and a current source in series with said resistance and said load impedance, means connecting said base electrode directly to a point of reference potential, a capacity connected between said point of reference potential and a point between said resistance and load impedance, a source of alternating current having a range of values of magnitude, a source of forward bias current and two resistors in series connected between said point of reference potential and said emitter and providing emitter current of approximately one tenth milliampere, a condenser connected between said point of reference potential and the junction of said last named two resistors, said last named two resistors and said condenser comprising a time constant circuit, means for capacitively coupling said source of alternating current to an input circuit comprising said emitter and base, said last named two resistances and said source of forward bias current having a resistance of approximately 250,000 ohms and thereby constituting a constant-current bias network for said emitter, said time constant circuit having a time constant long in comparison with the period of said alternating current but short in comparison with the period of expected amplitude variations in said alternating current and being proportioned to develop a voltage linearly related to the peak value of said alternating current by rectification in said emitter-base circuit while the emitter bias current remains constant, said parallel inductance and capacity comprising a tuned circuit connected between said collector and base, across which tuned circuit appear output signals at the frequency of said alternating current, the amplitude of the voltage of said output signals being limited to a single predetermined value for said range of values of magnitude of said first-mentioned alternating current, and a varistor diode connected directly between the emitter electrode and the base electrode and having its anode connected to the emitter electrode for clipping the positive peaks of the alternating current signal from said source of alternating current, said varistor diode having a smaller forward impedance than the emitter-base impedance of said transistor.

References Cited in the file of this patent

UNITED STATES PATENTS

| | | |
|---|---|---|
| 2,222,688 | Rumpel | Nov. 26, 1940 |
| 2,434,929 | Holland et al. | Jan. 27, 1948 |
| 2,595,208 | Bangert | Apr. 29, 1952 |
| 2,644,895 | Lo | July 7, 1953 |
| 2,652,460 | Wallace | Sept. 15, 1953 |
| 2,655,609 | Shockley | Oct. 13, 1953 |
| 2,655,610 | Ebers | Oct. 13, 1953 |
| 2,731,571 | Chauce | Jan. 17, 1956 |
| 2,733,359 | Brown | Jan. 31, 1956 |
| 2,759,052 | Macdonald et al. | Aug. 14, 1956 |

FOREIGN PATENTS

| | | |
|---|---|---|
| 414,187 | Great Britain | Aug. 2, 1934 |

OTHER REFERENCES

RCA Receiving Tube Manual, 1947 ed., p. 29, pub. 1947 by RCA, Harrison, N.J.

UNITED STATES PATENT OFFICE

CERTIFICATE OF CORRECTION

Patent No. 2,894,150 July 7, 1959

Calvin C. Bopp

It is hereby certified that error appears in the printed specification of the above numbered patent requiring correction and that the said Letters Patent should read as corrected below.

Column 3, line 36, for "particularly" read -- particular --; column 3, line 41, for "effective" read -- effecting --; column 4, line 33, for "2,300 ohms" read -- 3,300 ohms --.

Signed and sealed this 8th day of December 1959.

(SEAL)

Attest:

KARL H. AXLINE

Attesting Officer

ROBERT C. WATSON

Commissioner of Patents